(12) United States Patent
Kubota

(10) Patent No.: US 7,902,755 B2
(45) Date of Patent: Mar. 8, 2011

(54) LIGHT-EMITTING DEVICE AND ELECTRONIC APPARATUS

(75) Inventor: Takehiko Kubota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 290 days.

(21) Appl. No.: 11/851,771

(22) Filed: Sep. 7, 2007

(65) Prior Publication Data

US 2008/0079360 A1    Apr. 3, 2008

(30) Foreign Application Priority Data

Oct. 3, 2006 (JP) ................................. 2006-271575

(51) Int. Cl.
H01L 51/50 (2006.01)
(52) U.S. Cl. ........................................ 313/512; 313/504
(58) Field of Classification Search .................. 313/512, 313/500, 505, 506, 504
See application file for complete search history.

(56) References Cited

U.S. PATENT DOCUMENTS

| | | | |
|---|---|---|---|
| 6,781,162 B2 | 8/2004 | Yamazaki et al. | |
| 7,109,653 B2 | 9/2006 | Imamura | |
| 7,265,391 B2 | 9/2007 | Yamazaki et al. | |
| 2003/0164674 A1* | 9/2003 | Imamura | 313/493 |
| 2004/0212759 A1* | 10/2004 | Hayashi | 349/84 |
| 2006/0081844 A1* | 4/2006 | Hirosue et al. | 257/59 |
| 2006/0087229 A1* | 4/2006 | Kim | 313/509 |
| 2006/0158108 A1 | 7/2006 | Hayashi | |
| 2006/0158111 A1 | 7/2006 | Hayashi | |
| 2006/0202615 A1* | 9/2006 | Murakami et al. | 313/506 |
| 2006/0270305 A1 | 11/2006 | Imamura | |
| 2007/0114921 A1 | 5/2007 | Yamazaki et al. | |

FOREIGN PATENT DOCUMENTS

| | | |
|---|---|---|
| JP | A 11-74073 | 3/1999 |
| JP | A-2003-288994 | 10/2003 |
| JP | A 2004-95199 | 3/2004 |
| JP | A-2006-222070 | 8/2006 |
| JP | A-2006-222071 | 8/2006 |
| WO | WO 03/061346 A1 | 7/2003 |

* cited by examiner

Primary Examiner — Joseph L Williams
Assistant Examiner — Andrew J Coughlin
(74) Attorney, Agent, or Firm — Oliff & Berridge, PLC

(57) ABSTRACT

Disclosed herein is a light-emitting device including: a substrate; a plurality of light-emitting elements which are arranged on the substrate, each having two electrodes with a light-emitting layer interposed therebetween; an insulating film which is formed on the substrate and insulates the two electrodes from each other; a peripheral layer which is formed on the substrate and is located outside the insulating film; and a sealing layer which is formed on the substrate and covers the plurality of light-emitting elements and the insulating film, wherein the sealing layer is formed of a single-layer or a plural-layer thin film, and wherein, in the single-layer or the plural-layer thin film, an end of a thin film having the largest thickness is interposed between the insulating film and the peripheral layer.

4 Claims, 8 Drawing Sheets

LIGHT-EMITTING DEVICE AND ELECTRONIC APPARATUS

BACKGROUND

1. Technical Field

The present invention relates to a light-emitting device including light-emitting elements as organic light-emitting diodes (OLEDs) and an electronic apparatus including the light-emitting device.

2. Related Art

An OLED has a configuration in which a solid light-emitting layer formed of an organic electroluminescence (EL) material is interposed between a cathode and an anode. As the light-emitting device including the OLED, a light-emitting device in which a plurality of OLEDs are arranged on a substrate as pixels is known. In this light-emitting device, the pixels are sealed and are protected against external air. As one of sealing methods, there is provided a thin-film sealing method of forming a thin film on a substrate to configure a sealing layer by the formed thin film. In this thin film sealing method, the sealing layer may be configured by a single layer as disclosed in JP-A-11-74073 or by a plurality of layers as disclosed in JP-A-2004-95199.

FIG. 11 is a cross-sectional view showing a light-emitting device (single-layer configuration) of the related art. A plurality of pixels are arranged in a central portion (not shown) of a pixel substrate 501. The pixels penetrate through a pixel partition 502 on the pixel substrate 501 and a light-emitting region of the pixels is partitioned in the pixel partition 502. A cathode layer 503 is formed on the pixel substrate 501 so as to cover the pixel partition 502. The cathode layer 503 is a cathode which is common to the plurality of pixels, that is, a common cathode. On the pixel substrate 501, a peripheral layer 504 is formed between the pixel partition 502 and a circumferential end of the pixel substrate 501. On the pixel substrate 501, a sealing layer is formed so as to cover the peripheral layer 504 and the cathode layer 503. The sealing layer is formed of a single-layer thin film. In more detail, the sealing layer is a gas barrier film 505 formed of an inorganic material.

FIG. 12 is a cross-sectional view showing a light-emitting device (plural-layer configuration) of the related art. In this light-emitting device, a peripheral layer is not provided between a pixel partition 502 and a circumferential end of a pixel substrate 501. A sealing layer is formed of a three-layer thin film. In more detail, the sealing layer includes an electrode protective film 506 formed on the pixel substrate 501, an organic buffer layer formed thereon, and a gas barrier film 508 formed thereon. These thin films cover a cathode layer 503. The organic buffer layer 507 is formed of an organic material. The electrode protective film 506 and the gas barrier film 508 are formed of inorganic materials and extend beyond the end of the organic buffer film 507.

The width of a frame of the light-emitting device in which the plurality of pixels are arranged on the substrate is preferably narrow. In particular, when the light-emitting device is used as a display device, the narrow frame is of importance. However, in the above-described light-emitting devices of the related art, the position (P1 of FIG. 11) of the end of the gas barrier film 505 or the position (P2 of FIG. 12) of the end of the organic buffer film 507 significantly varies for each light-emitting device. Accordingly, a wide substrate needs to be used and thus the width of the frame widens.

The position P1 or P2 significantly varies according to a method of forming the sealing layer, in each light-emitting device. Since the sealing layer is formed after forming the pixels, the sealing layer is preferably formed using a method which has a negligible influence on the pixels. For example, if the pixel is an OLED, a deposition method or a coating method is generally used. In particular, the employment of a method which has a negligible influence on the pixels is important when a film having a certain degree of thickness, such as the gas barrier film 505 or the organic buffer film 507, is formed. However, in the employable method, positional precision of the end of the formed layer becomes low. Accordingly, the position P1 or P2 significantly varies for each light-emitting device.

SUMMARY

An advantage of some aspects of the invention is that it provides a light-emitting device capable of realizing a narrow frame although a single-layer or plural-layer thin film configuring a sealing layer is formed with low positional precision, and an electronic apparatus including the light-emitting device.

In the following description, a light-emitting element is, for example, an OLED. A peripheral layer may be used to protect a circuit or a wiring line. A circuit protected by the peripheral layer may be a circuit for driving or controlling the light-emitting element. A wiring line protected by the peripheral layer may be a wiring line for supplying current to the light-emitting element or a wiring line for allowing current for driving the light-emitting element to flow.

According to an aspect of the invention, there is provided a light-emitting device including: a substrate; a plurality of light-emitting elements which are arranged on the substrate, each having two electrodes with a light-emitting layer interposed therebetween; an insulating film which is formed on the substrate and insulates the two electrodes from each other; a peripheral layer which is formed on the substrate and is located outside the insulating film; and a sealing layer which is formed on the substrate and covers the plurality of light-emitting elements and the insulating film, wherein the sealing layer is formed of a single-layer or a plural-layer thin film, and wherein, in the single-layer or the plural-layer thin film, an end of a thin film having the largest thickness is interposed between the insulating film and the peripheral layer. If the sealing layer is formed of the single-layer thin film, the number of films having the largest thickness is 1. If the sealing layer is formed of the plural-layer thin film, the number of films having the largest thickness is 1 or plural.

In this light-emitting device, the peripheral layer is interposed between the end of the substrate and the end of the film having the largest thickness of the single-layer or plural-layer thin film configuring the sealing layer which covers the light-emitting elements and the insulating film. Accordingly, although the positional precision of the end of the film having the largest thickness is low, if the positional precision of the end of the peripheral layer is high, it is possible to reduce the width of the frame. A method of providing the peripheral layer is optional. When the single-layer or plural-layer thin film configuring the sealing layer includes the film excluding the film having the largest thickness, the included film can be formed with high positional precision, without influencing the light-emitting elements. According to this light-emitting device, it is possible to realize a narrow frame although the single-layer or plural-layer thin film configuring the sealing layer is formed with low positional precision.

According to another aspect of the invention, there is provided a light-emitting device including: a substrate; a plurality of light-emitting elements which are arranged on the substrate, each having two electrodes with a light-emitting layer interposed therebetween; an insulating film which is formed on the substrate and insulates the two electrodes from each other; a peripheral layer which is formed on the substrate and is located outside the insulating film; and a sealing layer which is formed on the substrate and covers the plurality of light-emitting elements and the insulating film, wherein the sealing layer is formed of a plural-layer thin film, wherein the plural-layer thin film includes an organic buffer film formed of an organic material, and wherein an end of the organic buffer film is interposed between the insulating film and the peripheral layer.

In this light-emitting device, the peripheral layer is interposed between the end of the substrate and the end of the organic buffer film which covers the light-emitting elements and the insulating film. Accordingly, although the positional precision of the end of the organic buffer film is low, if the positional precision of the end of the peripheral layer is high, it is possible to reduce the width of the frame. A method of providing the peripheral layer is optional. Accordingly, the peripheral layer can be formed with high positional precision. In the plural-layer thin film configuring the sealing layer, the film excluding the organic buffer film can be formed with high positional precision, without influencing the light-emitting elements. According to this light-emitting device, it is possible to realize a narrow frame although the gas barrier film is formed with low positional precision.

The light-emitting device may further include a seal material which is provided on the substrate so as to surround the insulating film and supports an additional substrate different from the substrate, the plural-layer thin film may include a gas barrier film which is formed of an inorganic material so as to cover the organic buffer layer and extends in a direction angled with respect to the substrate over a length according to a thickness of the organic buffer film in the vicinity of the end of the organic buffer film, and a portion of the gas barrier film, which extends in the angled direction, and the seal material may be separated from each other. According to this configuration, since the seal material does not contact the angled portion of the gas barrier film, it is possible to suppress breakage of the gas barrier film.

The light-emitting device may further include a wiring line which is formed on the substrate and extends linearly, the end of the organic buffer film between insulating film and the peripheral layer may be located on the wiring line, and the end of the organic buffer film located on the wiring line may be substantially parallel to the wiring line. Since the end of the organic buffer film is linearly formed on a flat surface, sealing performance is improved. The wiring line located below the end of the organic buffer film may be a wiring line for supplying current to the light-emitting element or a wiring line for allowing current for driving the light-emitting element to flow.

According to another aspect of the invention, there is provided a light-emitting device including: a substrate; a plurality of light-emitting elements which are arranged on the substrate, each having two electrodes with a light-emitting layer interposed therebetween; an insulating film which is formed on the substrate and insulates the two electrodes from each other; a peripheral layer which is formed on the substrate and is located outside the insulating film; and a sealing layer which is formed on the substrate, is formed of an inorganic material, and covers the plurality of light-emitting elements and the insulating film, wherein the sealing layer is formed of a single-layer thin film, wherein the single-layer thin film is a gas barrier film formed of an inorganic material, and wherein an end of the gas barrier film is interposed between the insulating film and the peripheral layer.

In this light-emitting device, the peripheral layer is interposed between the end of the substrate and the end of the gas barrier film which covers the light-emitting elements and the insulating film. Accordingly, although the positional precision of the end of the gas barrier film is low, if the positional precision of the end of the peripheral layer is high, it is possible to reduce the width of the frame. A method of providing the peripheral layer is optional. Accordingly, the peripheral layer can be formed with high positional precision. The sealing layer is formed of only the gas barrier film. According to this light-emitting device, it is possible to realize a narrow frame although the gas barrier film is formed with low positional precision.

The light-emitting device may further include a seal material which is provided on the substrate so as to surround the insulating film and supports an additional substrate different from the substrate, the gas barrier film may extend in a direction angled with respect to the substrate over a length according to a thickness of the insulating film in the vicinity of an end of the insulating film, and a portion of the gas barrier film, which extends in the angled direction, and the seal material may be separated from each other. By this configuration, since the seal material does not contact the angled portion of the gas barrier film, it is possible to suppress breakage of the gas barrier film.

The light-emitting device may further include a wiring line which is formed on the substrate and extends linearly, the end of the gas barrier film between the insulating film and the peripheral layer may be located on the wiring line, and an end of an organic buffer film located on the wiring line may be substantially parallel to the wiring line. Since the end of the gas barrier film is linearly formed on a flat surface, sealing performance is improved. The wiring line located below the end of the gas barrier film may be a wiring line for supplying current to the light-emitting element or a wiring line for allowing current for driving the light-emitting element to flow.

An electronic apparatus according to the invention includes any one of the above-described light-emitting devices. Accordingly, the above-described effects can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
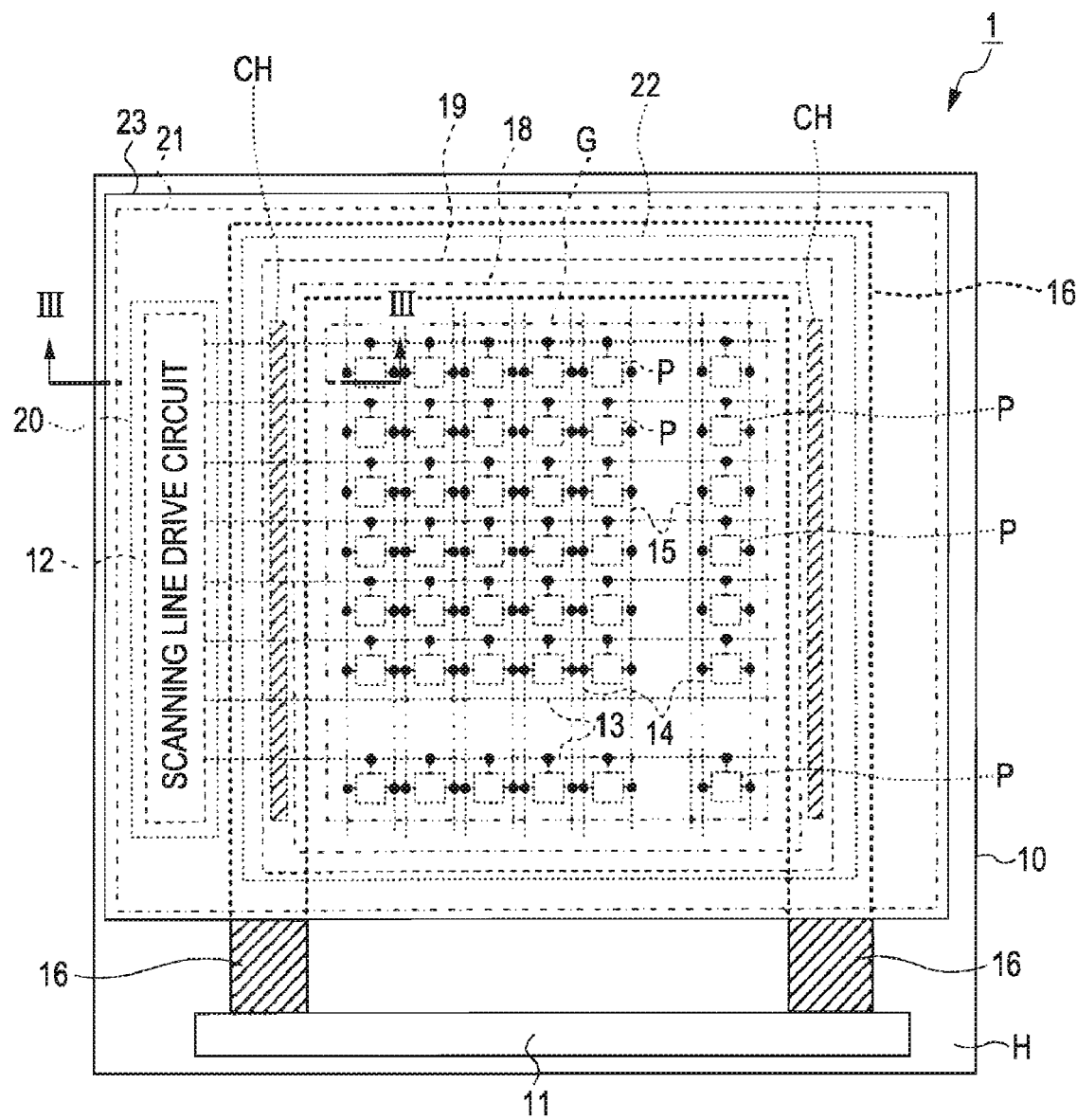
FIG. 1 is a schematic plan view showing a portion of the configuration of a light-emitting device 1 according to a first embodiment of the invention.

Hereinafter, embodiments of the invention will be described with reference to the accompanying drawings. In the drawings, a ratio of the dimensions of the elements may be different from that of actual elements.

First Embodiment

FIG. 1 is a schematic plan view showing a portion of the configuration of a light-emitting device 1 according to a first embodiment of the invention. The light-emitting device 1 includes a substrate 10. A connection terminal 11 is formed on one end of the substrate 10. The connection terminal 11 receives a variety of signals or a power supply voltage from an external circuit. On the substrate 10, a rectangular pixel region G and a peripheral area H are located between the pixel region G and an outer circumference of the substrate 10. In the peripheral region H, a scanning line drive circuit 12 and a data line drive circuit, (not shown) are formed. In the pixel region G, a plurality of scanning lines 13 and a plurality of data lines 14 are formed and a plurality of unit circuits (pixel circuits) P are provided in the vicinity of the intersections the scanning lines 13 and the data lines 14.

Figure 2:
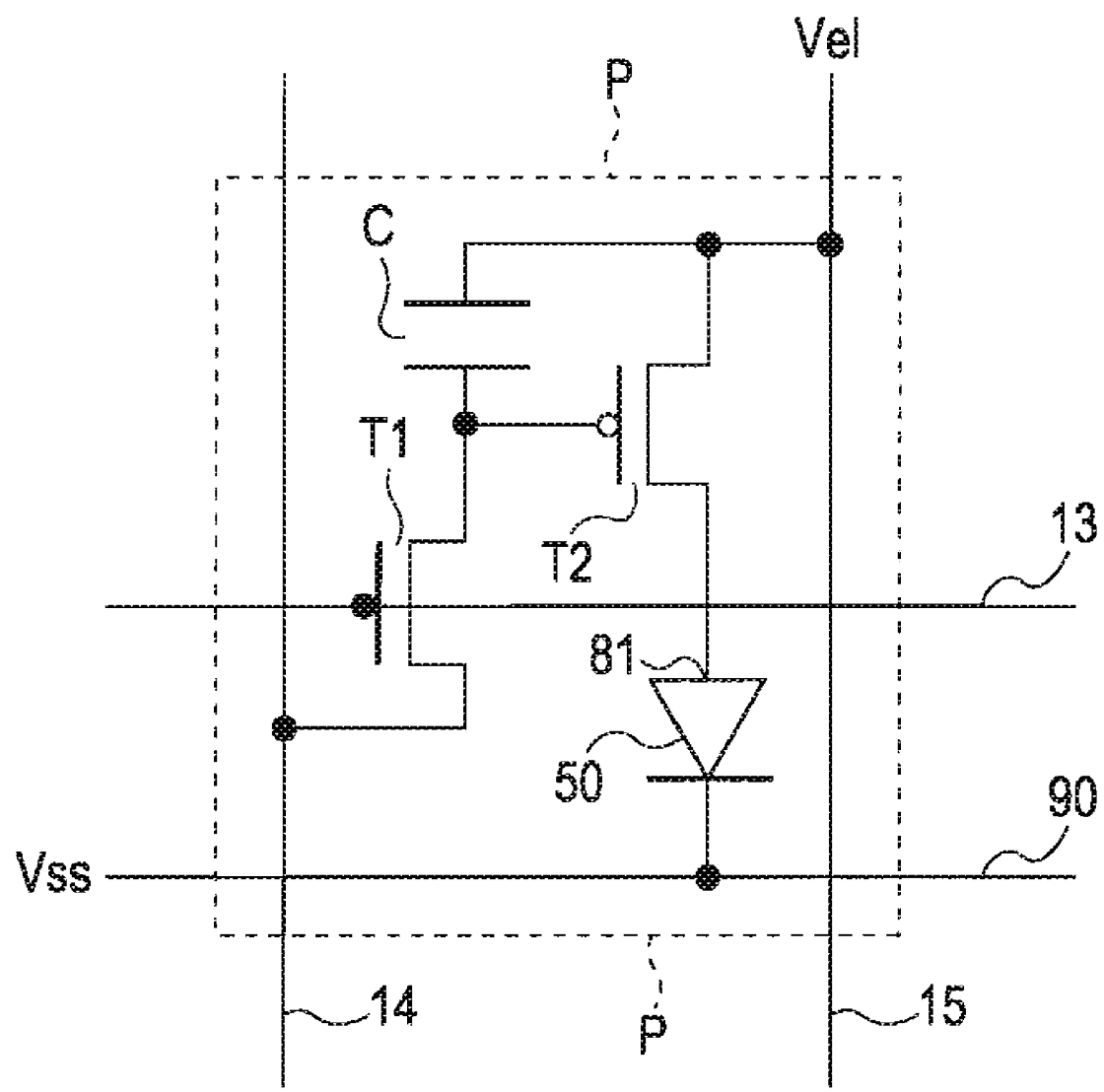
FIG. 2 is a circuit diagram showing in detail a unit circuit P of the light-emitting device 1.

FIG. 2 is a circuit diagram showing in detail the unit circuit P of the light-emitting device 1. Each unit circuit P includes an N-channel-type transistor T1, a P-channel-type transistor T2, a capacitive element C and an OLED 50. A source electrode of the P-channel-type transistor T2 is connected to a current supply line 15 and a drain electrode thereof is connected to an anode 81 of the OLED 50. The current supply line 15 supplies current for driving the OLED 50. The capacitive element C is provided between the source electrode and a gate electrode of the transistor T2. A gate electrode of the N-channel-type transistor T2 is connected to the scanning line 13, a source electrode thereof is connected to the data line 14, and a drain electrode thereof is connected to the gate electrode of the transistor T2.

In the unit circuit P, when the scanning line 13 corresponding to the unit circuit P is selected by the scanning line drive circuit 12, the transistor T1 is turned on and a data signal supplied from the data line drive circuit (not shown) through the data line 14 is held in the capacitive element C. The transistor T2 supplies current according to the level of the data signal to the OLED 50. Accordingly, the OLED 50 emits light with brightness according to the level of the data signal.

As shown in FIG. 1, in the peripheral region H of the substrate 10, a cathode power-supply wiring line 16 is formed in a U shape so as to surround the pixel region G. That is, the cathode power-supply wiring line 16 extends in a linear shape along the circumference of the pixel region G and is bent at two positions substantially at a right angle. The cathode power-supply wiring line 16 is interposed between the scanning line drive circuit 12 and the pixel region G. The cathode power-supply wiring line 16 supplies current for driving the OLED 50. The OLED 50 has an anode (one of two electrodes), a cathode (the other of the two electrodes) and a light-emitting function layer interposed therebetween.

Figure 3:
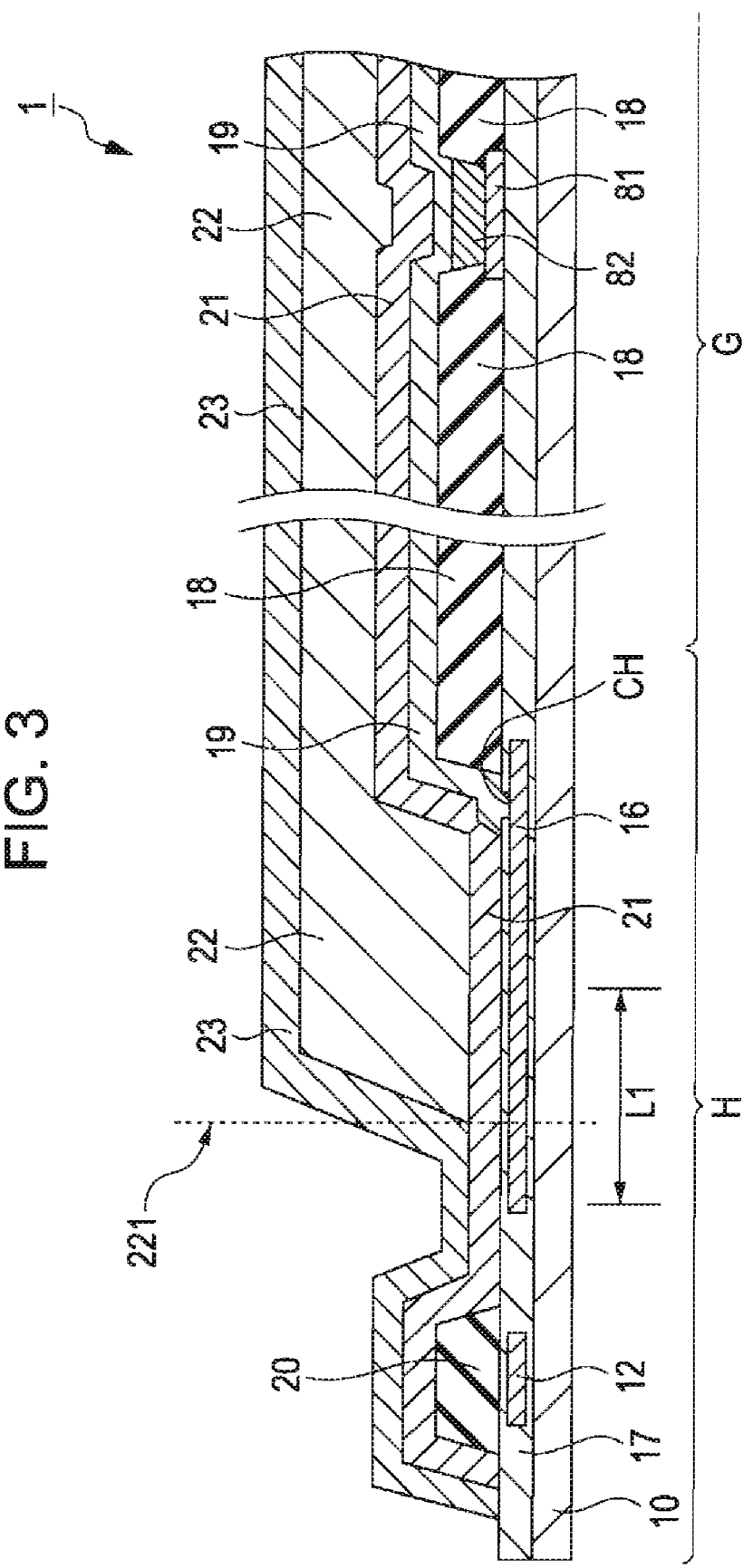
FIG. 3 is a cross-sectional view taken along line III-III of the light-emitting device 1 shown in FIG. 1.

FIG. 3 is a cross-sectional view taken along line III-III of the light-emitting device 1 shown in FIG. 1. On the substrate 10, an underlying protective layer (not shown) formed of silicon oxide is formed and a wiring layer 17 including a metal wiring line is formed thereon. In the wiring layer 17, the transistor T1 and the transistor T2 are provided in each unit circuit P of the pixel region G. In the wiring layer 17, the scanning line drive circuit 12 or the data line drive circuit (not shown) are provided in the peripheral region H. These circuits have circuit elements such as transistors and capacitive elements. The metal wiring layer is formed of a conductive material such as aluminum and a portion thereof includes the electrodes of the transistors, the scanning line 13, the data line 14, the current supply line 15, and the cathode power-supply wiring line 16.

On the wiring layer 17, the anode 81 of the OLED 50 is provided in each unit circuit P of the pixel region G. The anode 81 is electrically connected to the drain electrode of the transistor T2 of its unit circuit P through a corresponding contact hole. An insulating film 18 is formed on the wiring layer 17 and the anode 81. The insulating film 18 insulates the anode 81 and the cathode of the OLED 50, is formed of acrylic or polyimide, and covers the wiring layer 17 and the anode 81 so as to expose only at least a portion of the upper surface of the anode 81 in the pixel region G. An outer end of the insulating film 18 is located at the peripheral region H. In a region surrounded by the insulating film 18, a light-emitting function layer 82 is formed on the anode 81. An end surface of the light-emitting function layer 82 contacts the insulating film 18. The light-emitting function layer 82 includes a light-emitting layer formed of an organic EL material. The organic EL material may be a low-molecular-weight material or a high-molecular-weight material. The light-emitting function layer 82 may include a portion or all of a hole injection layer, a hole transport layer, an electron transport layer and a hole block layer and an electron block layer, in addition to the light-emitting layer.

A cathode layer 19 is formed on the insulating film 18 and the light-emitting function layer 82. The cathode layer 19 is formed of a conductive material and is formed, for example, using a deposition method, The cathode layer 19 may include a plurality of layers. The cathode layer 19 is formed over the entire surface of the pixel region G and the peripheral region H and is commonly provided in the plurality of unit circuits P. A portion of the cathode layer 19 becomes the cathode of the OLED 50 in the corresponding unit circuit P. In the peripheral region H, the cathode layer 19 overlaps the cathode power-supply wiring line 16 and is electrically connected to the cathode power-supply wiring line 16 through a contact hole CH formed in the wiring layer 17. An end of the cathode layer 19 is located on the wiring layer 17.

As described above, the light-emitting function layer 82 is provided in each unit pixel P and the insulating film 18 is provided so as to partition a region in which the light-emitting function layer 82 is formed. Although a configuration in which a portion of the light-emitting function layer 82 and the insulating film 18 overlap with each other is shown in plan view, the invention is not limited to this configuration. A configuration in which the light-emitting function layer 82 and the insulating film 18 are exclusively provided (a configuration in which the light-emitting function layer and the insulating film 18 do not overlap) may be employed.

As another configuration example, the light-emitting function layer and the cathode layer 19 may be commonly provided with respect to the plurality of unit circuits P in at least the pixel region. At this time, a region to which the light-emitting function layer emits light is partitioned by the insulating film 18 and a region which emits light according to the cathode 81 is provided. The region which emits light may overlap the periphery of the insulating film 18. The light-emitting function layer and the cathode layer 19 are provided so as to cover the insulating film 18 and the anode 82.

On the wiring layer 17, a peripheral wall 20 is formed in the peripheral region H. The peripheral wall 20 is formed of acrylic or polyimide. It is preferable that the peripheral wall 20 is formed in the same process as the insulating film 18. That is, in the present embodiment, the insulating film 18 and the peripheral wall 20 are formed of the same insulating layer. It is preferable that the insulating layer is provided so as to insulate the two electrodes of the OLED 50 and to cover a drive circuit such as the scanning line drive circuit 12 or the data line drive circuit. The peripheral wall 20 is a structure for protecting the scanning line drive circuit 12 or the data line drive circuit (not shown) and is provided so as to cover the scanning line drive circuit 12 or the data line drive circuit (not shown).

A sealing layer for protecting the OLED 50 against external air is formed on the wiring layer 17, the cathode layer 19 and the peripheral wall 20. The sealing layer is formed by laminating three thin films. The three thin films include a cathode protective film formed on the wiring layer 17, the cathode layer 19 and the peripheral wall 20, an organic buffer film 22 formed on the cathode protective film 21, and a gas barrier film 23 formed on the cathode protective film 21 and the organic buffer film 22, The cathode protective film 21 protects the cathode layer 19 or facilitates the formation of the organic buffer film 22 and extends so as to cover at least the cathode layer 19. In the present embodiment, an end of the cathode protective film 21 is located outside the peripheral wall 20. The cathode protective film 21 is formed of an inorganic material. The inorganic material may include silicon oxide or silicon oxynitride or metal oxide such as titanium oxide.

The organic buffer film 22 covers a step of the cathode protective film 21 which is formed in each pixel clue to the shape of the insulating film 18, prevents concentration of stress in the gas barrier film 23, and is formed of an organic material. The organic buffer film 22 is formed, for example, by a coating method (for example, a printing method) such that the upper surface thereof is planarized. The organic buffer film 22 extends so as to cover the cathode layer 19 and is formed above at least the insulating film 18 in at least the pixel region. An end 221 of the organic buffer film 22 have a rectangular shape so as to surround the pixel region G and are interposed between the insulating film 18 and the peripheral wall 20. Among the sides of the end 221 of the organic buffer film 22, three sides are located above the cathode power-supply wiring line 16. The end 221 located on the cathode power-supply wiring-line 16 are substantially parallel to the cathode power-supply wiring line 16.

The gas barrier film 23 prevents oxygen or moisture from entering and extends so as to cover the cathode protective film 21 and the organic buffer film 22. The gas barrier film 23 extends in the vicinity of the end 221 of the organic buffer film 22 in a direction angled with respect to the substrate 10 over a length according to the thickness of the organic buffer film 22. The gas barrier film 23 is formed of an inorganic material such as silicon oxide or a silicon compound. In the present embodiment, the gas barrier film 23 contacts an underlying layer (the cathode protective film 21, in the present embodiment) in a region between a region in which the peripheral wall 20 is provided and a region in which the insulating film 18 is provided. The underlying layer may be an insulating film included in the wiring layer 17. The underlying layer is preferably a silicon compound such as silicon oxide, silicon oxynitride or silicon nitride.

The position of the end 221 of the organic buffer film 22 may vary in a range of L1 shown in FIG. 3 in the light-emitting device 1. However, although the position of the end 221 varies in this range, the peripheral wall 20 is provided between the end of the substrate 10 and the end 221 of the organic buffer film 22 which covers the OLED 50 and the insulating film 18. Accordingly, in the light-emitting device 1, if the positional precision of the end of the peripheral wall 20 is high although the positional precision of the end 221 is low, the width of the frame can be reduced.

In addition, in the light-emitting device 1, the peripheral wall can be formed before forming the OLED 50. That is, the peripheral wall 20 can be formed with high positional precision.

Among the three thin films configuring the sealing layer, the films (the cathode protective film 21 and the gas barrier film 23) excluding the organic buffer film 22 can be formed with high positional precision, without influencing the OLED 50.

Accordingly, in the light-emitting device 1, it is possible to realize a narrow frame although the organic buffer film 22 configuring the sealing layer is formed with low positional precision.

In the light-emitting device 1, among the three sides of the end 221 of the organic buffer film 22 are substantially parallel to the cathode power-supply wiring line 16 and are located on the cathode power-supply wiring line 16. That is, a large portion of the end 221 of the organic buffer film 22 are located on a flat surface. Accordingly, sealing performance is improved. A wiring line located below the end 221 of the organic buffer film 22 is not limited to the cathode power-supply wiring line 16 and may be, for example, a wiring line which is connected to the current supply line 15 to supply current to the unit circuit P. The configuration of the above-described unit circuit P is only exemplary.

The features of the present embodiment, are as follows. In the present embodiment, the insulating film 18 and the peripheral wall 20 are provided at the same insulating layer, the insulating layer is provided so as to cover the pixel region and the drive circuit, and a region in which the insulating layer is not provided is provided between the region in which the pixel region is provided and the region in which the drive circuit is provided. The end 221 of the organic buffer film 22 is located in the region in which the insulating is not provided and the gas barrier layer 23 contacts the underlying layer in this region. In the region in which the insulating layer is not provided, it is preferable that a wiring line connected to the cathode power-supply wiring line 16 or the current supply line 15 is provided. Here, the drive circuit may be the scanning line drive circuit, the data line drive circuit or a test circuit.

Second Embodiment

Figure 4:
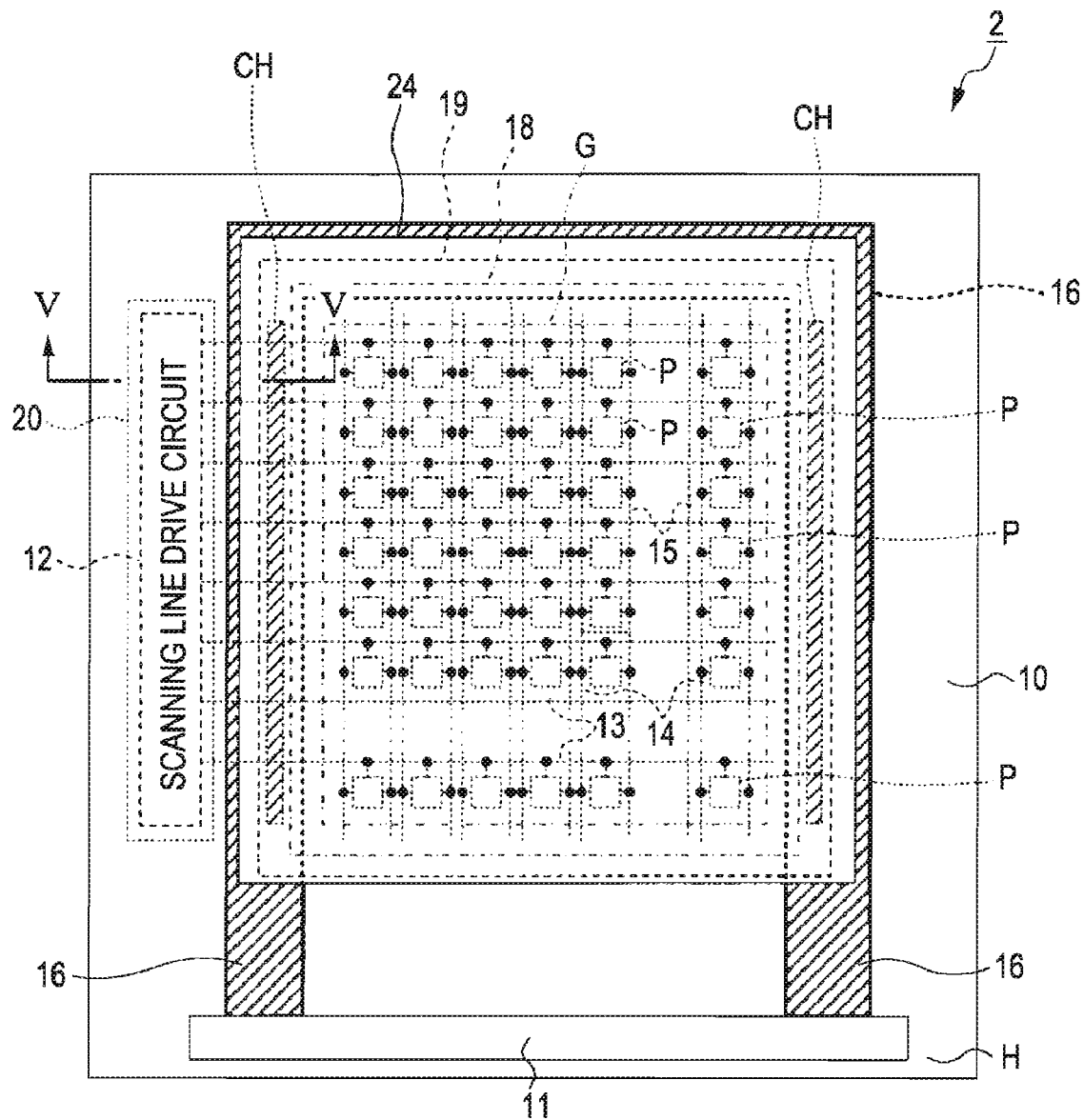
FIG. 4 is a schematic plan view showing a portion of the configuration of a light-emitting device 2 according to a second embodiment of the invention.
Figure 5:
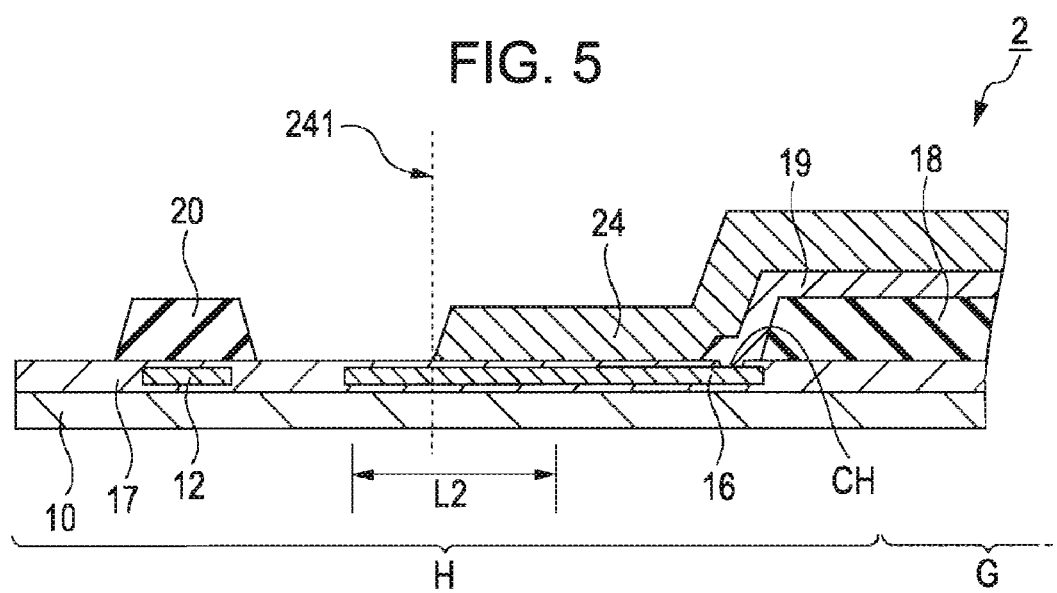
FIG. 5 is a cross-sectional view taken along line VI-VI of the light-emitting device 2 shown in FIG. 4.

FIG. 4 is a schematic plan view showing a portion of the configuration of a light-emitting device 2 according to a second embodiment of the invention. FIG. 5 is a cross-sectional view taken along line V-V of the light-emitting device 2 shown in FIG. 4. The light-emitting device 2 is different from the light-emitting device 1 in that a sealing layer is formed of a single-layer thin film. In the light-emitting device 2, the sealing layer for protecting an OLED 50 against external air is formed on a wiring layer 17 and a cathode layer 19. This sealing layer is formed of the single-layer thin film. This thin film is a gas barrier film 24 formed on the wiring layer 17 and the cathode layer 19.

The gas barrier film 24 prevents oxygen or moisture from entering and extends so as to cover the cathode protective film 21. The gas barrier film 24 extends in the vicinities of the outer ends of an insulating film 18 in a direction angled with respect to the substrate 10 over a length according to the thickness of the insulating film 18. In the present embodiment, the gas barrier film 24 contacts at least an underlying layer (the insulating film or the wiring layer included in the wiring layer 17) in a region between the region in which a peripheral wall 20 is provided and the region in which the insulating film 18 is provided. The underlying layer is preferably formed of a silicon compound such as silicon oxide, silicon oxynitride or silicon nitride. Ends 241 of the gas barrier 24 have substantially a rectangular shape so as to surround the pixel region G and are interposed between the insulating film 18 and the peripheral wall 20. Among the ends 241 of the gas barrier film 24, three sides are located on a cathode power-supply wiring line 16. The ends 241 located on the cathode power-supply wiring line 16 are substantially parallel to the cathode power-supply wiring line 16. The gas barrier film 24 is formed of an inorganic material such as silicon oxide or a silicon compound.

The position of the end 241 of the gas barrier film 24 may vary in a range of L2 shown in FIG. 5 in each light-emitting device 1. However, although the position of the end 241 varies in this range, the peripheral wall 20 is provided between the end of the substrate 10 and the end 241 of the gas barrier film 24 which covers the OLED 50 and the insulating film 18. Accordingly, in the light-emitting device 2, if the positional precision of the end of the peripheral wall 20 is high although the positional precision of the end 241 is low, the width of the frame can be reduced. Accordingly, in the light-emitting device 2, it is possible to realize a narrow frame although the gas barrier film 24 configuring the sealing layer is formed with low positional precision.

In the light-emitting device 2, among the ends 241 of the gas barrier film 24, the three sides are substantially parallel to the cathode power-supply wiring line 16 and are located on the cathode power-supply wiring line 16. Accordingly, sealing performance is improved. A wiring line located below the ends 241 of the gas barrier film 24 is not limited to the cathode power-supply wiring line 16. The configuration of the above-described unit circuit P shown in FIG. 2 is only exemplary, similar to the light-emitting device 1.

The features of the present embodiment are as follows. In the present embodiment, the insulating film 18 and the peripheral wall 20 are provided at the same insulating layer, the insulating layer is provided so as to cover the pixel region and the drive circuit, and a region in which the insulating layer is not provided is provided between the region in which the pixel region is provided and the region in which the drive circuit is provided. The gas barrier 24 contacts the underlying layer in the region in which the insulating layer is not provided. In the region in which the insulating layer is not provided, it is preferable that a wiring line connected to the cathode power-supply wiring line 16 or a current supply line 15 is provided. Here, the drive circuit may be the scanning line drive circuit, the data line drive circuit or a test circuit.

Third Embodiment

Figure 6:
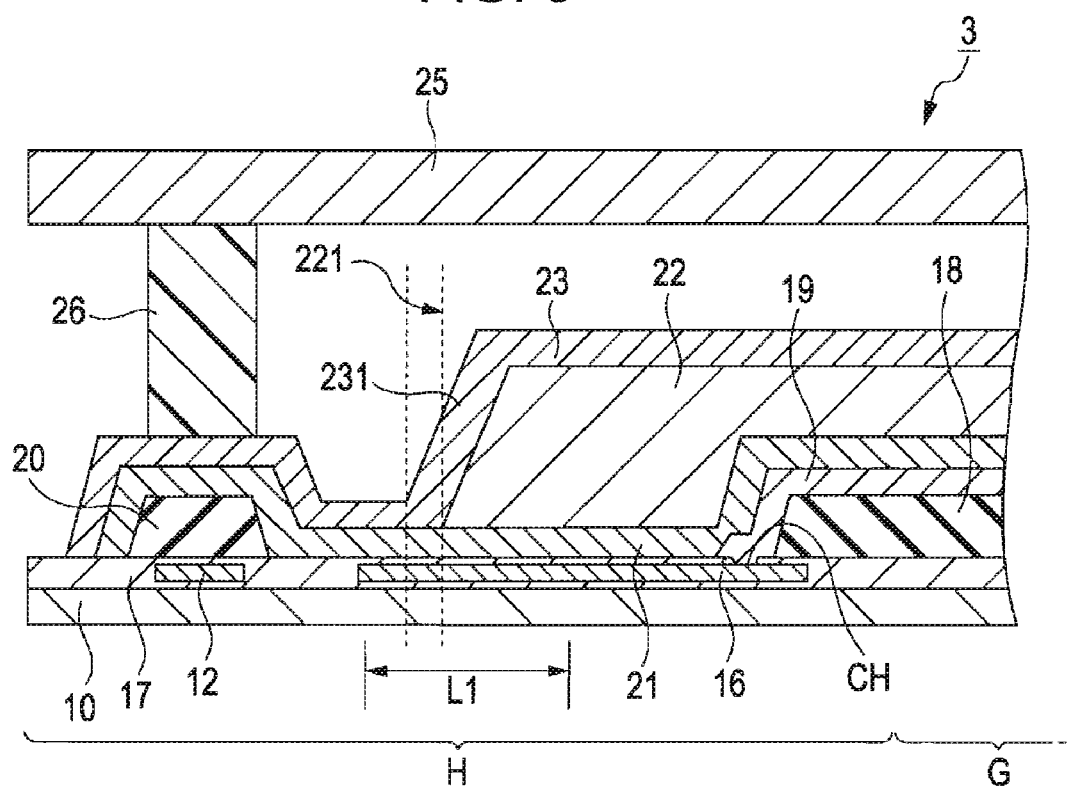
FIG. 6 is a cross-sectional view showing a portion of a light-emitting device 3 according to a third embodiment of the invention.

FIG. 6 is a cross-sectional view showing a portion of a light-emitting device 3 according to a third embodiment of the invention. The light-emitting device 3 is different from the light-emitting device 1 in that an additional substrate is included in addition to the substrate 10. The additional substrate is a counter substrate 25 which faces the substrate 10 with an OLED 50 interposed therebetween. The counter substrate 25 is, for example, a color filter substrate and is supported by a seal material 26.

A filling material formed of resin is filled between the side of the substrate 10, on which the OLED 50 is provided, and the counter substrate 25.

Although external air is prevented from reaching the OLED 50 by the gas barrier film 23 in the first and second embodiments, sealing performance is further improved by the filling material, the seal material 26 and the counter substrate 25 in the present embodiment.

The seal material 26 is formed of, for example, resin and is provided on the gas barrier film 23 so as to surround the insulating film 18. One end of the seal material 26 is attached to the gas barrier film 23 and the other end thereof is attached to the counter substrate 25. The seal material 26 of the gas barrier film 23 contacts a portion on a peripheral wall 20. That is, the seal material 26 and a portion 231 of the gas barrier film 23 which extends in a direction slope with respect to the substrate 10 are separated from each other.

When the seal material 26 contacts the portion 231, the gas barrier film 24 is susceptible to be broken due to stress concentration. However, as described above, in the light-emitting device 3, the portion 231 and the seal material 26 do not contact each other. In addition, the upper surface of the peripheral wall 20 is substantially flat. Accordingly, according to the light-emitting device 3, it is possible to suppress the breakage of the gas barrier film 23, in addition to the effect of the light-emitting device 1.

In the present embodiment, since the seal material 26 and the peripheral wall 20 overlap each other compared with the configuration in which the gas barrier film 23 and an organic buffer film 22 cover the peripheral wall 20 and the pixel region and the seal material 26 is provided at the outer region thereof, it is possible to realize a narrow frame of the light-emitting device 3. Since a wiring line such as a cathode power-supply wiring line 16 can be provided in a margin region which is provided in order to prevent the end 221 of the organic buffer film 22 and the seal material 26 from overlapping each other, it is possible to realize a narrow frame of the light-emitting device 3.

Fourth Embodiment

Figure 7:
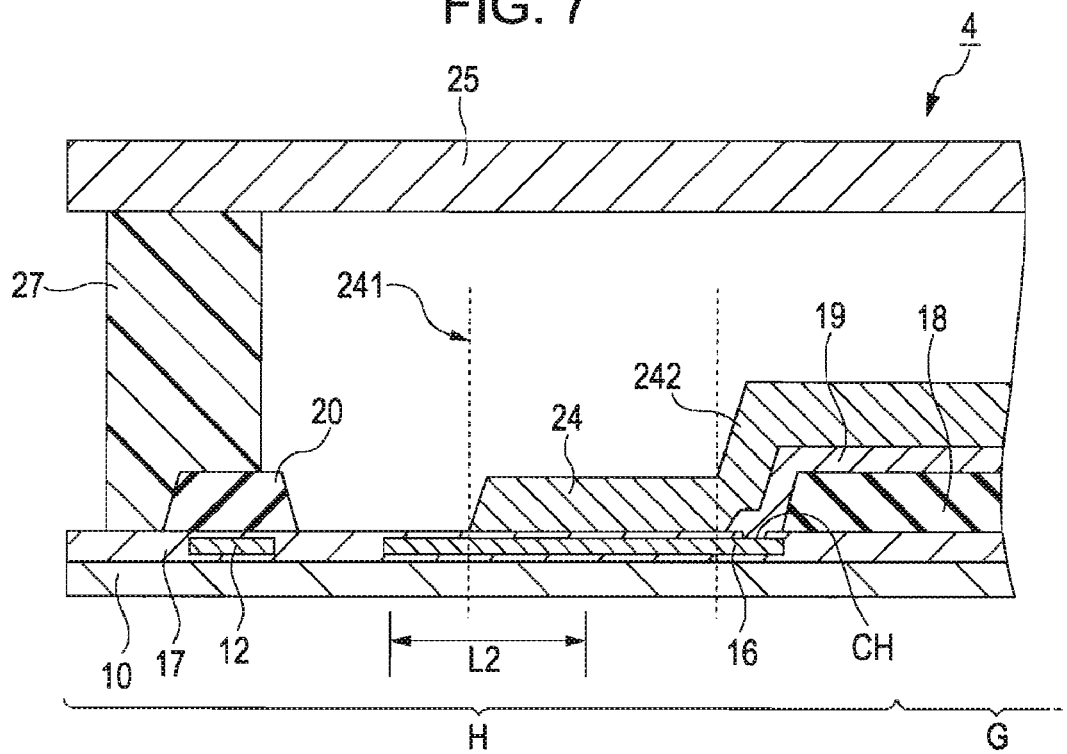
FIG. 7 is a cross-sectional view showing a portion of a light-emitting device 4 according to a fourth embodiment of the invention.

FIG. 7 is a cross-sectional view showing a portion of a light-emitting device 4 according to a fourth embodiment of the invention. The light-emitting device 4 is different from the light-emitting device 2 in that a counter substrate 25 is included in addition to the substrate 10. The counter substrate 25 is supported by a seal material 27. The seal material 27 is formed of, for example, resin and is provided on a wiring layer 17 and a peripheral wall 20 so as to surround an insulating film 18. One end of the seal material 27 is attached to the wiring layer 17 and the peripheral wall 20 and the other end thereof is attached to the counter substrate 25. The seal material 27 and a portion 242 of the gas barrier film 24 which extends in a direction slope with respect to the substrate 10 are separated from each other.

When the seal material 27 contacts the portion 242, the gas barrier film 24 is susceptible to be broken due to stress concentration. However, as described above, in the light-emitting device 4, the portion 242 and the seal material 27 do not contact, each other and are separated from each other. Accordingly, according to the light-emitting device 4, it is possible to suppress the breakage of the gas barrier film 24, in addition to the effect of the light-emitting device 2.

Similar to the third embodiment, it is possible to realize a narrow frame of the light-emitting device 4.

MODIFIED EXAMPLE

Although the sealing layer is formed of a single-layer or three-layer thin film in the above-described embodiments, the sealing layer may be a two-layer thin film or a four-layer thin film. In either case, a film having a largest thickness is formed using a method, in which the positional precision of the end of the formed film is low. The number of films which is formed using a method in which the positional precision of the end of the formed film is low may be plural. A circuit protected by the peripheral wall is not limited to the scanning line drive circuit and may be the data line drive circuit or the test circuit. A component protected by the peripheral wall is not limited to the circuit. For example, a wiring line may be protected by the peripheral wall. The light-emitting element is not limited to the OLED.

APPLICATION EXAMPLES

Next, electronic apparatuses using each of the light-emitting devices according to the above-described embodiments will be described.

Figure 8:
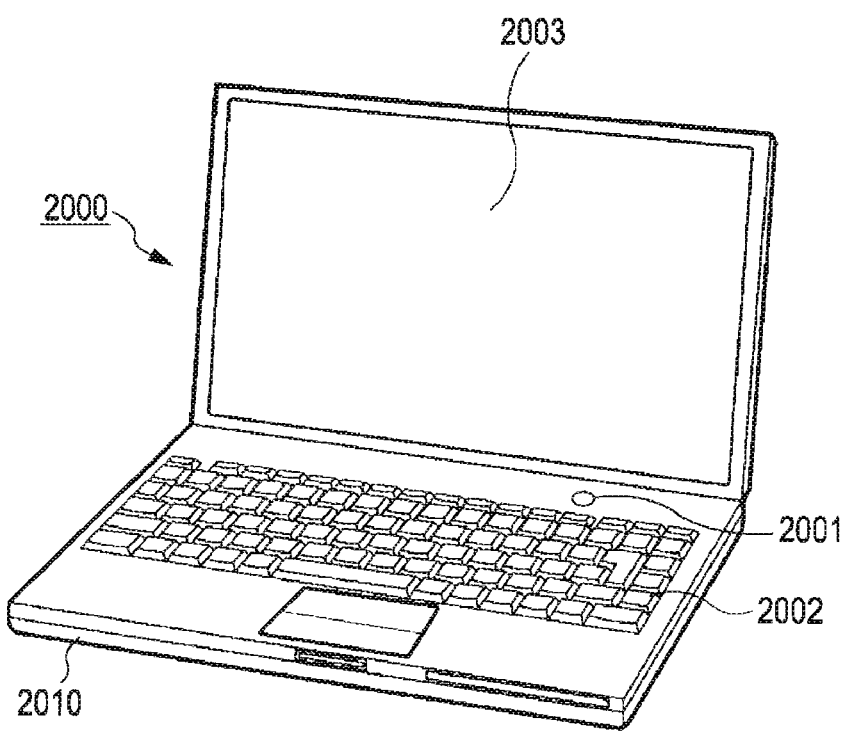
FIG. 8 is a view showing the configuration of a mobile type personal computer which employs each of the light-emitting devices according to the embodiments of the invention as a display device.

FIG. 8 is a view showing the configuration of a mobile type personal computer which employs each of the light-emitting devices according to the embodiments of the invention as a display device. The personal computer 2000 includes a display device 2003 and a main body portion 2010. In the main body portion 2010, a power supply switch 2001 and a keyboard 2002 are provided.

Figure 9:
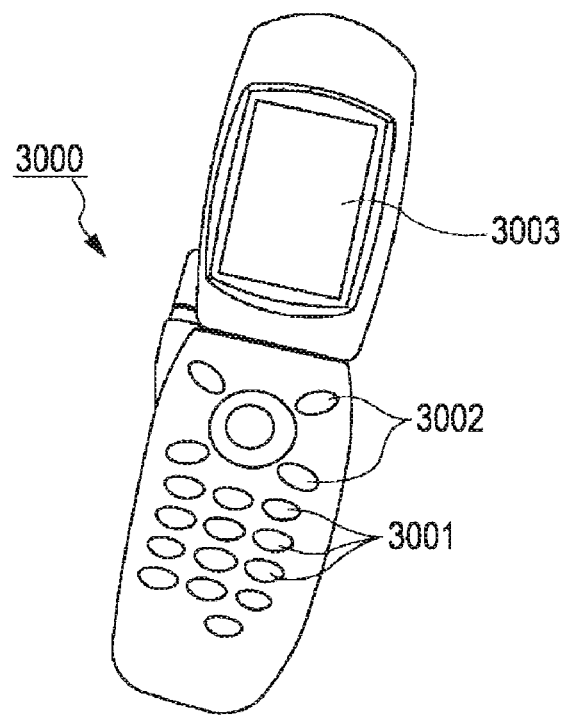
FIG. 9 is a view showing the configuration of a mobile telephone which employs each of the light-emitting devices according to the embodiments of the invention as a display device.

FIG. 9 is a view showing the configuration of a mobile telephone which employs each of the light-emitting devices according to the embodiments of the invention as a display device. The mobile telephone 3000 includes a plurality of operation buttons 3001, a scroll button 3002 and a display device 3003. By operating the scroll button 3002, a screen displayed on the display device 3003 is scrolled.

Figure 10:
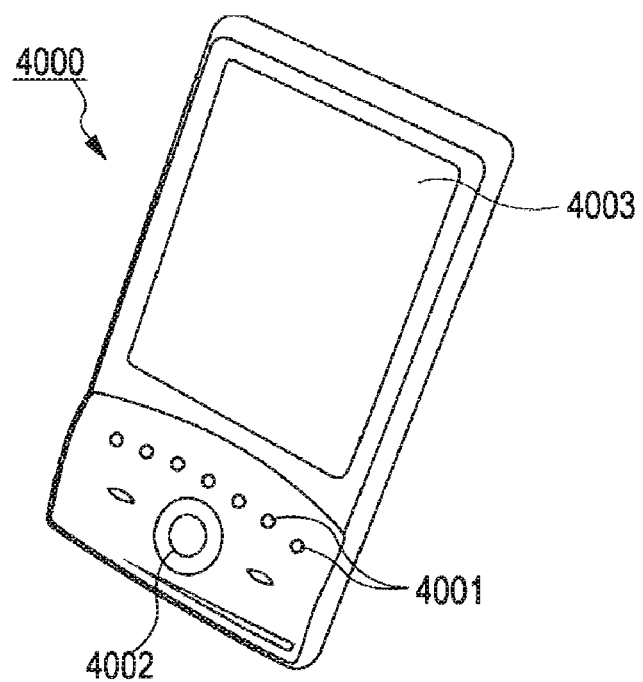
FIG. 10 is a view showing the configuration of a personal digital assistant which employs each of the light-emitting devices according to the embodiments of the invention as a display device.
Figure 11:
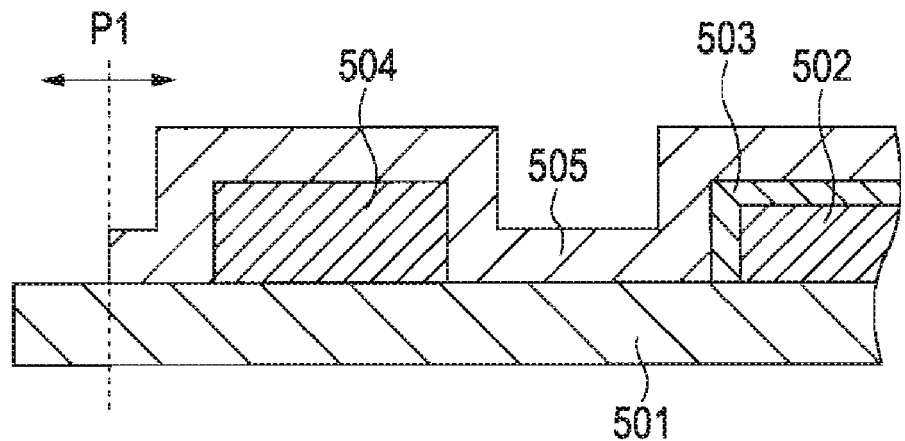
FIG. 11 is a cross-sectional view showing a light-emitting device (single-layer configuration) of the related art.
Figure 12:
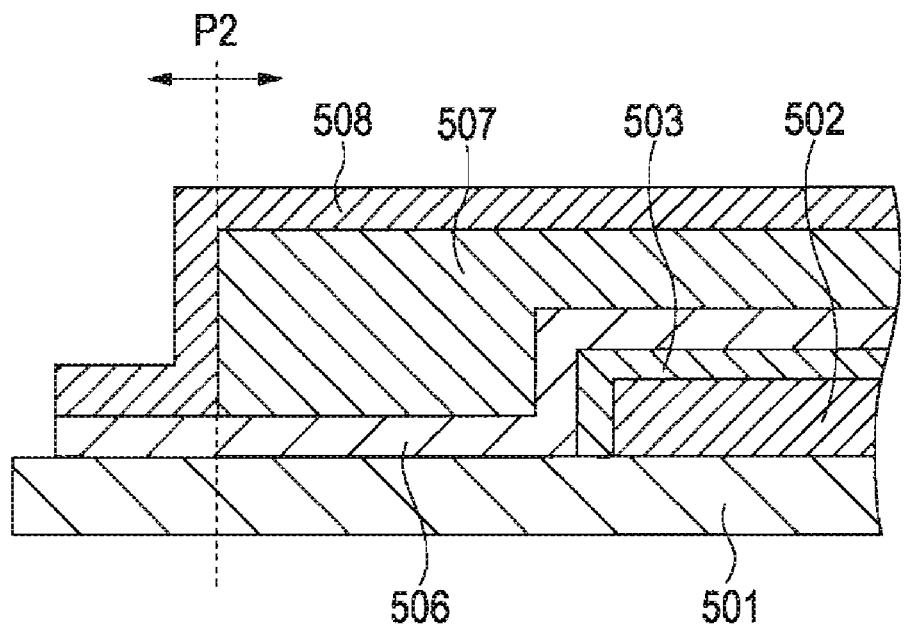
FIG. 12 is a cross-sectional view showing a light-emitting device (plural-layer configuration) of the related art.

FIG. 10 is a view showing the configuration of a personal digital assistant which employs each of the light-emitting devices according to the embodiments of the invention as a display device. The personal digital assistant 4000 includes a plurality of operation buttons 4001, a power supply switch 4002 and a display device 4003. When the power supply switch 4002 is operated, a variety of information such as an address book or a schedule book is displayed on the display device 4003.

As the electronic apparatus using the light-emitting device according to the invention, there is an apparatus for displaying an image, such as a television set or a video camera, or an electrophotographic image forming apparatus.

The entire disclosure of Japanese Patent Application No. 2006-271575, filed Oct. 3, 2006 is expressly incorporated by reference herein.

What is claimed is:

1. A light-emitting device comprising:
a substrate;
a plurality of light-emitting elements which are arranged above the substrate, each having a first electrode and a second electrode with a light-emitting layer interposed therebetween;
an insulating film which is formed above the substrate and insulates the first electrode and the second electrode from each other;
a peripheral layer which is formed above the substrate and is located closer to an end of the substrate than the insulating film; and
a sealing layer which is formed above the substrate and covers the plurality of light-emitting elements and the insulating film,
wherein the sealing layer is formed of a plural-layer thin film, the plural-layer thin film including at least a first layer, a second layer, and a third layer, the first layer being interposed between the second layer and the third layer, the second layer contacting the third layer between the insulating film and the peripheral layer,
wherein the plural-layer thin film includes an organic buffer film formed of an organic material,
wherein an end of the organic buffer film is interposed between the insulating film and the peripheral layer and is separated from the peripheral layer in plan view,
wherein the light-emitting device further includes:
a cathode layer which is formed above the substrate; and
a wiring line which is formed above the substrate, wherein an end of the wiring line extends beyond the cathode layer and beyond the end of the organic buffer film, and
wherein the second layer contacts the cathode layer.

2. The light-emitting device according to claim 1, further comprising a seal material which is provided above the substrate so as to surround the insulating film and supports an additional substrate different from the substrate,
wherein the plural-layer thin film includes a gas barrier film which is formed of an inorganic material so as to cover the organic buffer layer and extends in a direction angled with respect to the substrate over a length according to a thickness of the organic buffer film in the vicinity of the end of the organic buffer film, and
wherein a portion of the gas barrier film, which extends in the angled direction, and the seal material are separated from each other.

3. The light-emitting device according to claim 1, further comprising a wiring line which is formed above the substrate and extends linearly,
wherein the end of the organic buffer film between the insulating film and the peripheral layer is located above the wiring line, and
wherein the end of the organic buffer film located above the wiring line is substantially parallel to the wiring line.

4. An electronic apparatus comprising the light-emitting device according to claim 1.

* * * * *